(12) United States Patent
Pachner et al.

(10) Patent No.: US 11,271,601 B1
(45) Date of Patent: Mar. 8, 2022

(54) PRE-DISTORTION PATTERN RECOGNITION

(71) Applicant: Honeywell International Inc., Charlotte, NC (US)

(72) Inventors: Daniel Pachner, Prague (CZ); Vladimir Havlena, Prague (CZ)

(73) Assignee: Honeywell International Inc., Charlotte, NC (US)

( * ) Notice: Subject to any disclaimer, the term of this patent is extended or adjusted under 35 U.S.C. 154(b) by 0 days.

(21) Appl. No.: 17/074,096

(22) Filed: Oct. 19, 2020

(51) Int. Cl.
*H03F 1/32* (2006.01)
*H04B 1/04* (2006.01)

(52) U.S. Cl.
CPC ......... *H04B 1/0475* (2013.01); *H03F 1/3247* (2013.01); *H04B 2001/0425* (2013.01)

(58) Field of Classification Search
CPC .. H03F 2200/451; H03F 1/3247; H03F 3/245; H03F 3/24; H03F 3/195; H03F 3/189; H03F 1/3241; H03F 1/3258; H03F 2200/102; H03F 3/19; H03F 3/193; H03F 3/21; H03F 2201/3224; H04B 1/0475; H04B 2001/0425; H04B 1/04; H04B 2001/0408; H04B 2001/045; H04B 17/13; H04B 1/40; H04B 17/104; H04B 17/12; H04B 1/0483; H04B 1/12; H04B 1/16; H04B 2001/0433; H04L 27/368; H04L 25/03343; H04L 27/2614; H04L 25/03834; H04L 25/0202; H04L 25/022; H04L 25/0224; H04L 25/03828; H04L 27/01; H04L 27/2618; H04L 27/2624; H04L 27/3405

USPC ............... 375/297, 296, 350; 455/114.3, 126
See application file for complete search history.

(56) References Cited

U.S. PATENT DOCUMENTS

| | | |
|---|---|---|
| 5,148,448 A | 9/1992 | Karam et al. |
| 6,476,670 B1 | 11/2002 | Wright et al. |
| 6,498,529 B1 | 12/2002 | Kim et al. |
| 6,545,535 B2 | 4/2003 | Andre |
| 6,587,514 B1 | 7/2003 | Wright et al. |
| 6,774,834 B2 | 8/2004 | Dartois |
| 6,985,033 B1 | 1/2006 | Shirali et al. |
| 6,998,909 B1 | 2/2006 | Mauer |
| 7,499,501 B2 | 3/2009 | Chung et al. |
| 8,384,476 B2 | 2/2013 | Draxler et al. |
| 8,471,632 B2 | 6/2013 | Onishi et al. |
| 8,494,463 B2 | 7/2013 | Davies |
| 9,288,099 B2 | 3/2016 | Simoens |
| 2003/0076894 A1* | 4/2003 | Jin ........................ H03F 1/3241 375/296 |

(Continued)

*Primary Examiner* — Eva Y Puente
(74) *Attorney, Agent, or Firm* — Fogg & Powers LLC

(57) ABSTRACT

Systems and methods for pre-distortion pattern recognition are provided. In certain embodiments, the system includes an electronic device that provides an output signal, wherein the electronic device applies distortion to the output signal. The system also includes a pre-distorter that provides an input signal to the electronic device, wherein the pre-distorter applies a pre-distortion to the input signal before the electronic device receives the input signal. Further, the system includes a pre-distorter design block that identifies the distortion from an association between the output signal and a finite set of symbols and updates the pre-distortion based on the association.

20 Claims, 5 Drawing Sheets

(56) References Cited

U.S. PATENT DOCUMENTS

| | | | | |
|---|---|---|---|---|
| 2004/0203542 A1* | 10/2004 | Seo | .................. | H03F 1/3247 |
| | | | | 455/126 |
| 2010/0297966 A1* | 11/2010 | Row | .................. | H03F 3/24 |
| | | | | 455/114.3 |
| 2012/0154038 A1* | 6/2012 | Kim | .................. | H04L 27/2626 |
| | | | | 330/149 |
| 2013/0243135 A1* | 9/2013 | Row | .................. | H04L 27/364 |
| | | | | 375/350 |

* cited by examiner

PRE-DISTORTION PATTERN RECOGNITION

BACKGROUND

Many electronic systems use power amplifiers to amplify signals. Power amplifiers should operate linearly to amplify signals efficiently and produce error-free signals. However, power amplifiers often exhibit non-linearities that distort both the amplitude and phase of the amplifier outputs. Many electronic systems account for the distortion by comparing the input and output of the power amplifier against one another. The electronic systems may then pre-distort the input of the power amplifier based on the comparison of the input and output. The ideal pre-distortion may be the dynamic inverse of the distortion applied by the power amplifier. After amplifying the pre-distorted signal, the output of the power amplifier may be a linear amplification of the original input signal before it was pre-distorted, perhaps with a pure time delay.

SUMMARY

Systems and methods for pre-distortion pattern recognition are provided. In certain embodiments, the system includes an electronic device that provides an output signal, wherein the electronic device applies distortion to the output signal. The system also includes a pre-distorter that provides an input signal to the electronic device, wherein the pre-distorter applies a pre-distortion to the input signal before the electronic device receives the input signal. Further, the system includes a pre-distorter design block that identifies the distortion from an association between the output signal and a finite set of symbols and updates the pre-distortion based on the association.

DRAWINGS

Drawings accompany this description and depict only some embodiments associated with the scope of the appended claims. Thus, the described and depicted embodiments should not be considered limiting in scope. The accompanying drawings and specification describe the exemplary embodiments, and features thereof, with additional specificity and detail, in which:

Under common practice, the various described features are not drawn to scale but are drawn to emphasize specific features relevant to the example embodiments.

DETAILED DESCRIPTION

In the following detailed description, reference is made to the accompanying drawings that form a part of the present description, and in which is shown, through illustration, specific illustrative embodiments. However, it is to be understood that other embodiments may be used and that logical, mechanical, and electrical changes may be made.

This description describes methods and systems for providing pre-distortion pattern recognition. As stated above, many electrical systems use power amplifiers. However, power amplifiers may operate non-linearly, causing the power amplifier to distort at least one of the amplitude and phase of received input signals. Systems may account for the nonlinear operation of the power amplifier by including a pre-distorter. The pre-distorter may be a device (or group of devices) that applies a pre-distortion to the input signal provided to the power amplifier. The ideal pre-distortion may be the dynamic inverse of the distortion that the power amplifier applies to the received input signal. The combination of the pre-distorter and the power amplifier may cause the linear amplification of the input signal.

Some systems calculate the pre-distortion using information from a known undistorted signal. For example, a system may calculate the pre-distortion by comparing the distorted signal to the undistorted signal. However, some systems may not have access to an undistorted signal and, therefore, cannot compare the distorted signal against an undistorted signal. For example, a signal receiver and some components in a signal transmitter may operate without an accessible undistorted signal.

While an undistorted signal may be inaccessible in some systems and components, the systems and components may store information describing a finite set of symbols that might be encoded within the distorted signal. The systems and components may use the information describing the finite set of symbols to recognize patterns in the distorted signal and then calculate the pre-distortion based on transformations of the distorted signal that cause the symbols in the distorted signal to match symbols in the finite set of symbols. The system may then apply the calculated pre-distortion to the input signal to the power amplifier.

Figure 1:
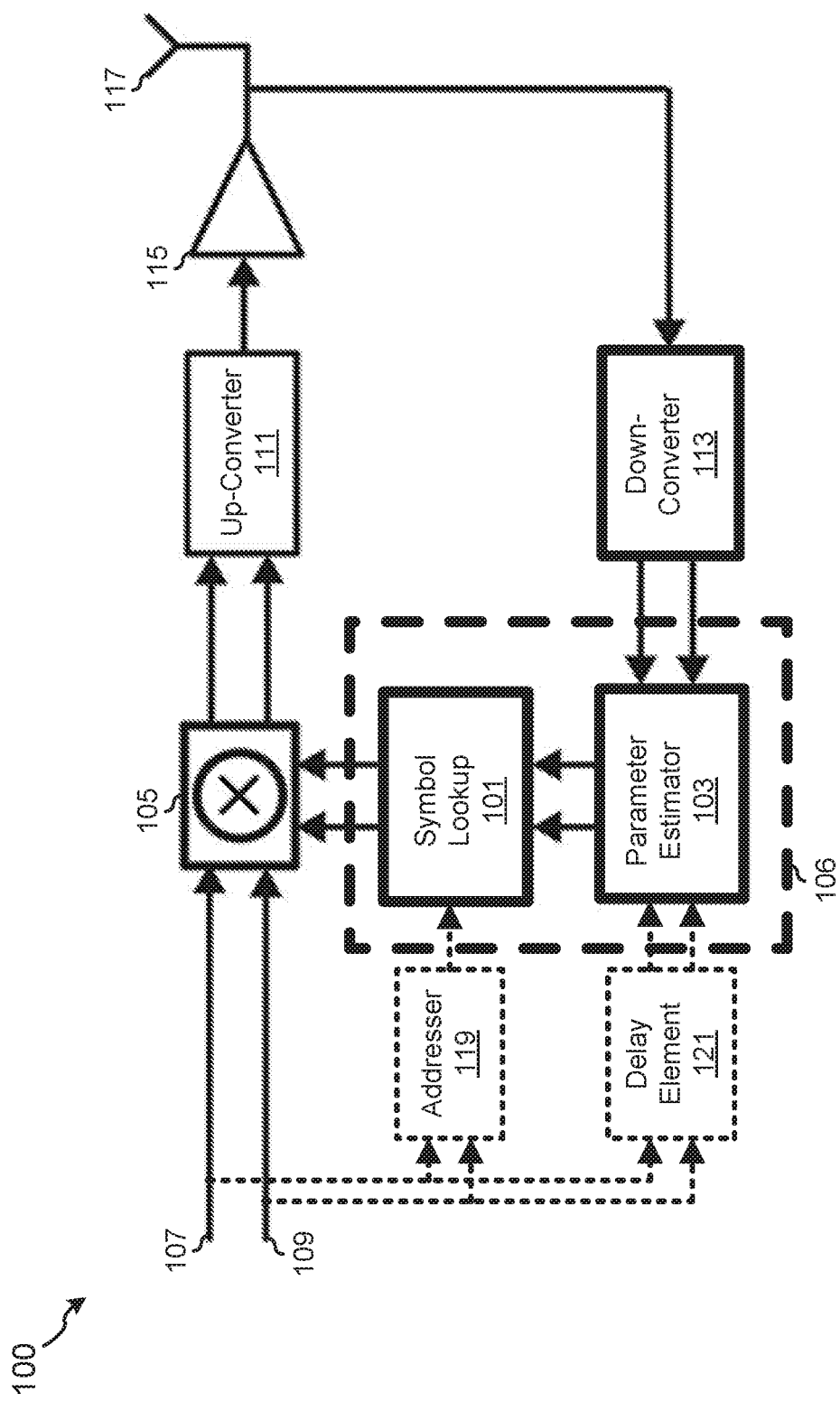
FIG. 1 is a block diagram illustrating a system for providing pre-distortion pattern recognition according to an aspect of the present disclosure.

FIG. 1 is a block diagram of a system 100 for providing pre-distortion pattern recognition. The system 100 may be a subsystem in a more extensive system that can receive input signals and provide output signals. For example, the system 100 may be part of a transmitter or a receiver. For example, when the system 100 is a transmitter, the system 100 may receive input signals for transmission through an antenna 117. Alternatively, when the system 100 is a receiver, the system 100 may receive input signals through the antenna 117 and provide the signals for further processing by a computational device coupled to the system 100.

In certain embodiments, the system 100 may include an amplifier 115. While FIG. 1 shows the amplifier 115, the amplifier 115 may be other electronic devices that potentially receive an input signal and add distortion to an output signal. As an amplifier 115, the amplifier 115 may receive power to amplify a received electrical signal. In some implementations, the amplifier 115 may be a power amplifier. Ideally, the amplifier 115 may linearly amplify received signals. However, the amplifier 115 may non-linearly amplify the received signals. In some systems, nonlinear amplification may cause distortions that decrease energy efficiency and increase errors in the amplified signals. The nonlinear amplification may cause distortions in both amplitude and phase of the amplified signals.

The system 100 may account for the distortion of the amplifier 115 by pre-distorting the signal before the amplifier 115 amplifies the signal. For example, the system 100 may pre-distort the pre-amplified signal by the inverse of the distortion applied by the amplifier 115. In some implementations, the distortion applied by the amplifier 115 may change with time, temperature, among other environmental and operational factors. To account for the changes in distortion, the pre-distortion applied by the system 100 may dynamically change to reflect changes to the distortion of the signal by the amplifier 115.

Typically, to calculate the pre-distortion, a system 100 may compare the output of the amplifier 115 against an undistorted input for the system 100. For example, in systems that have access to an undistorted input, a system 100 may include an addresser 119 and a delay element 121. The addresser 119 may identify symbols encoded in a signal received by the system 100. The delay element 121 may delay the signal to facilitate the comparison of a correlated, received symbol against a distorted symbol received from the amplifier 115.

In some embodiments, the system 100 may receive a single signal having the encoded symbols, or the system 100 may receive multiple signals, wherein each signal includes a portion of the data that encodes the symbols. For example, the system 100 may receive encoded symbols. The encoded signals may be encoded using quadrature amplitude modulation (QAM), quadrature phase-shift keying (QPSK), or other encoding schemes. The system 100 may receive an in-phase (I) signal 107 and a quadrature (Q) signal 109. The I signal 107 may be combined with the Q signal 109 to encode data associated with a particular point within a constellation. For example, in 16-QAM, the I signal 107 and the Q signal 109 may each use four different amplitude levels to encode particular symbols. Thus, combining the I signal 107 and the Q signal 109 may allow the encoding of 16 different symbols. Typically, each of the 16 symbols may correspond with four data bits.

In certain embodiments, the system 100 may include a pre-distorter design block 106. The pre-distorter design block 106 may be a group of electronic components that receives the distorted signal from the amplifier 115 and calculates a pre-distortion to apply to the input signal of the amplifier 115. The pre-distorter design block 106 may include a parameter estimator 103. Typically, the parameter estimator 103 may receive the input I signal 107 and the input Q signal 109 along with distorted, amplified I and Q data from the output of the amplifier 115. As shown, to provide the amplified I and Q data, the output of the amplifier 115 may pass through a down-converter 113. The down-converter 113 may down-convert the amplified signal into I and Q components to facilitate the comparison with the delayed I signal 107 and the Q signal 109.

In some embodiments, the parameter estimator 103 may compare the I signal 107 and the Q signal 109 against corresponding distorted I and Q signals received from the down-converter 113. The parameter estimator 103 may compare the distorted I and Q signals against the I signal 107 and the Q signal 109 to estimate the parameter encoded in the distorted I and Q signals. The parameter estimator 103 may provide the estimated parameter to a symbol lookup 101, which may be part of the pre-distorter design block 106. The symbol lookup 101 may use the estimated parameter to look up the symbol encoded within the signal amplified by the amplifier 115. Using the information about the estimated symbol, the symbol lookup 101 may calculate a pre-distortion signal to apply to the I signal 107 and the Q signal 109.

The system 100 may include a pre-distorter 105 coupled to receive the pre-distortion signal from the symbol lookup 101. As illustrated, the pre-distorter 105 may receive an I pre-distortion signal to mix with the I signal 107 and a Q pre-distortion signal to mix with the Q signal 109. The I pre-distortion signal and the Q pre-distortion signal may apply a pre-distortion to the I signal 107 and the Q signal 109 that is the inverse of the distortion applied by the amplifier 115. Further, the pre-distortion applied by the pre-distorter 105 may dynamically change as the distortion applied by the amplifier 115 changes. The pre-distorter 105 may provide the undistorted signal to an up-converter 111 that up-converts the pre-distorted I and Q signals for amplification by the amplifier 115. After the amplifier 115 amplifies the pre-distorted I and Q signals, the distortion applied by the amplifier 115 to the up-converted signal may be substantially equal to an up-converted I signal 107 and Q signal without the distortion of the amplifier 115.

In some embodiments, the pre-distorter design block 106, including the parameter estimator 103 and the symbol lookup 101, may be performed by a processor that accesses a memory unit or other manner for accessing stored data. The processor (or other potential computational devices) used in the system 100 or other systems and methods described herein may be implemented using software, firmware, hardware, or appropriate combination thereof. The processor and other computational devices may be supplemented by, or incorporated in, specially-designed application-specific integrated circuits (ASICs) or field programmable gate arrays (FPGAs). In some implementations, the processor may communicate through an additional transceiver with other computing devices outside of the system 100. The processor may also include or function with software programs, firmware, or other computer-readable instructions for carrying out various process tasks, calculations, and control functions used in the methods and systems described herein.

The methods described herein may be implemented by computer-executable instructions, such as program modules or components, which are executed by at least one processor. Generally, program modules include routines, programs, objects, data components, data structures, algorithms, and the like, which perform particular tasks or implement particular abstract data types.

Instructions for carrying out the various process tasks, calculations, and generation of other data used in the operation of the methods described herein can be implemented in software, firmware, or other computer-readable instructions. These instructions are typically stored on appropriate computer program products that include computer-readable media used for storage of computer-readable instructions or data structures. Such a computer-readable medium may be available media that can be accessed by a general-purpose or special-purpose computer or processor or any programmable logic device. For instance, memory used to store information within the system 100 may be an example of a computer-readable medium capable of storing computer-readable instructions and/or data structures.

Suitable computer-readable storage media (such as the memory in the system 100) may include, for example, non-volatile memory devices including semiconductor memory devices such as Random Access Memory (RAM), Read Only Memory (ROM), Electrically Erasable Programmable ROM (EEPROM), or flash memory devices; magnetic disks such as internal hard disks or removable disks; optical storage devices such as compact discs (CDs), digital versatile discs (DVDs), Blu-ray discs; or any other media that can be used to carry or store desired program code in the form of computer-executable instructions or data structures.

As shown in FIG. 1, the parameter estimator 103 and the symbol lookup 101 respectively receive input signals from the delay element 121 and the addresser 119. The signals provided by the addresser 119 and the delay element 121 may be derived from the undistorted I signal 107 and Q signal 109. However, in some embodiments, the system 100 may not have access to undistorted I signals 107 and Q signals 109. For example, the system 100 may be a receiver or other system lacking access to the undistorted I signals 107 and Q signals 109. In embodiments lacking the undistorted signals, the system 100 may not include the addresser 119 and the delay element 121.

In certain embodiments, to calculate a pre-distortion signal without using the undistorted I and Q signals, the system 100 may store a finite set of symbols that may encode information in the distorted output signal from the amplifier 115. The parameter estimator 103 may receive the distorted output signal from the amplifier 115 (through the down-converter 113). The parameter estimator 103 may determine parameters of a distorted signal transform. Applying the distorted signal transform to the distorted signal causes the distorted signal to consist of the said set of undistorted symbols. In some embodiments, the matching does not happen on the signal level, nor the symbol, but on the symbol set level, i.e., set equivalence is sought. In this embodiment, the predistorter design system does not search for a transform which achieves undistorted and distorted signals similarity, but the predistorter design system searches for a transform which achieves the distorted symbol set, after the transform is applied, to appear same or very similar as the undistorted signal set, or the alphabet, which is stored in memory of the system 100.

In typical embodiments, with the undistorted signal available, the signal transform representing the predistortion is sought by difference norm minimization. Often the second norm square may be used. If QAM encoding is used, the sum of squares of I a Q components differences are reduced. The difference between transformed distorted and undistorted signals is considered for each symbol. The norm is zero if all transformed distorted symbol matches the respective undistorted symbols exactly, i.e. the distortion is removed. Practically, the norm may be non-zero, as the distortion may be approximately removed. Typically, the function may have a single local minimum, and the optimization problem is convex. In some implementations, the optimization happens on the signal level, and both signals, undistorted and distorted, may be available.

In additional embodiments, where an ideal undistorted signal is unavailable, a disclosed ideal may be used. A non-negative function may be minimized with respect to predistorter parameters. The function may be zero when the transformed distorted symbol matches any symbol of the finite set of undistorted symbols and not just the undistorted symbol it represents. The minimized function value is positive when the transformed distorted symbol appears to be in the middle between any two different symbols. i.e. it does not match any symbol of the set. Considering a single distorted symbol, the minimized function has as many local minima as there are symbols in the alphabet. In this embodiment, the matching happens on the symbol set level and only the distorted signal is used, along with the symbol set or the alphabet.

In embodiments lacking access to the undistorted signal, the optimization result may appear to be undetermined as the minimized function value is zero when each transformed distorted symbol matches symbols in the set of symbols. Different permutations of the symbols may be indistinguishable as they could yield a same function value in contrast to when sufficient prior information about the sought transform is available: e.g. using the expectation of a smooth continuous function. Then there may be a single global minimum which can be found numerically via global numerical optimization methods. Typically, other possible solutions (permutations) may still represent local minima, of the minimized function. This represents a challenge as most convex optimization methods may fail in this embodiment.

In some embodiments, when calculating the pre-distortion signal, the parameter estimator 103 and symbol lookup 101 may use machine learning to identify the pre-distortion to apply to the signals to compensate for the distortion of the amplifier 115. For example, the system 100 may use deep learning, neural networks, or other machine learning algorithms to acquire and process information. For example, an offline trained neural network may solve a global optimization problem without executing global optimization methods in real time, which execution of optimization methods may be infeasible. The parameter estimator 103 and the symbol lookup 101 may identify the distortion caused by the amplifier 115 and the pre-distortion to apply based on the identified distortion.

Figure 2:
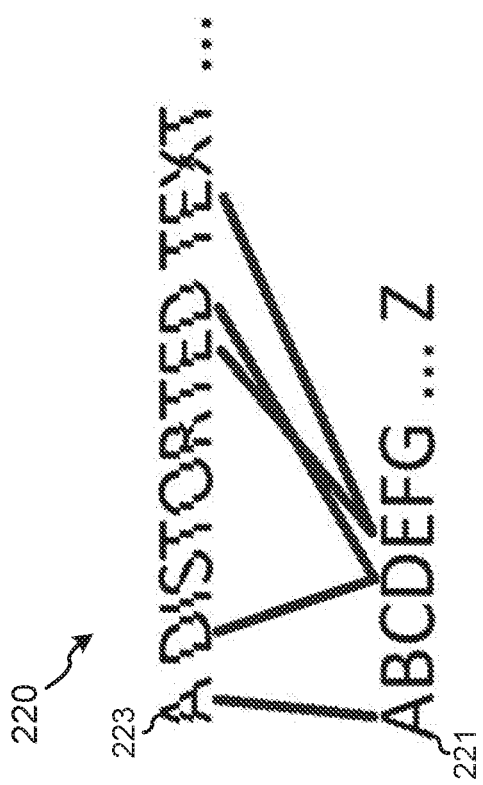
FIG. 2 is a diagram illustrating an example of identifying symbols from alphabets according to an aspect of the present disclosure.
Figure 2:
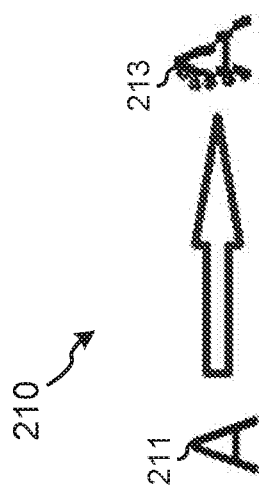

FIG. 2 is a diagram illustrating two examples for identifying decoded symbols. As shown, FIG. 2 provides a first example 210 and a second example 220. In the first example 210, a processor may have access to both an undistorted symbol 211 and a distorted symbol 213. The undistorted symbol 211 may be an encoded character or encoded data. The undistorted symbol 211 is illustrated as an alphabet character for illustrative purposes. The undistorted symbol 211 may be similar to an encoded symbol received by the system 100 through the I signal 107 and the Q signal 109. Also, the distorted symbol 213 may be similar to a symbol encoded within a distorted output signal from the amplifier 115.

In some embodiments, a system 100 may calculate the pre-distortion by comparing the undistorted symbol 211 against the distorted symbol 213. When the processor has access to the undistorted symbol 211, the system 100 may identify the differences between the undistorted symbol 211 and the distorted symbol 213. The system 100 then may apply the inverse of the identified differences (the pre-distortion) to the undistorted symbol 211. After the system 100 applies the pre-distortion to the undistorted symbol 211, the distortion applied by the amplifier 115 may cause the distorted symbol 213 to appear like the desired undistorted symbol 211.

In certain embodiments, the system 100 may not have access to undistorted symbols (like the undistorted symbol 211). In the second example 220, the system 100 does not have access to undistorted symbols, but the system 100 has access to a symbol library 221 and distorted symbols 223. As used herein, the symbol library 221 may refer to a finite set of symbols stored within the system 100. To calculate the pre-distortion to apply to a received signal, the system 100 may find a transform of the distorted symbols 223 against the symbols identified in the symbol library 221. The system 100 may then identify a transform to be applied to the distorted symbols 223. The transform applied to the distorted symbols 223 may cause the symbol set to appear similar to symbols of the symbol library 221. The matching of the distorted symbols 223 to the symbols in the symbol library 221 may be performed without a priori guessing as to the mapping of the distorted symbols 223 to the undistorted symbol library 221. Based on a transformation that transforms the distorted symbols 223 substantially into the symbols in the symbol library 221, the system 100 may calculate the pre-distortion. In some instances, the predistortion may transform some of the distorted symbols 223 into the symbols in the symbol library 221, where the pre-distortion transforms the distorted symbols 223 so that the symbols in the distorted symbols 223 are proximate to symbols found in the symbol library 221.

In exemplary embodiments, when the system 100 has calculated the pre-distortion, the system 100 may apply the inverse of the identified differences (the pre-distortion) to the undistorted symbol 211. After the system 100 applies the pre-distortion to the undistorted symbol 211, the distortion applied by the amplifier 115 or other distorting electrical components may cause the distorted symbol 213 to appear like a desired symbol found in the symbol library 221.

Figure 3:
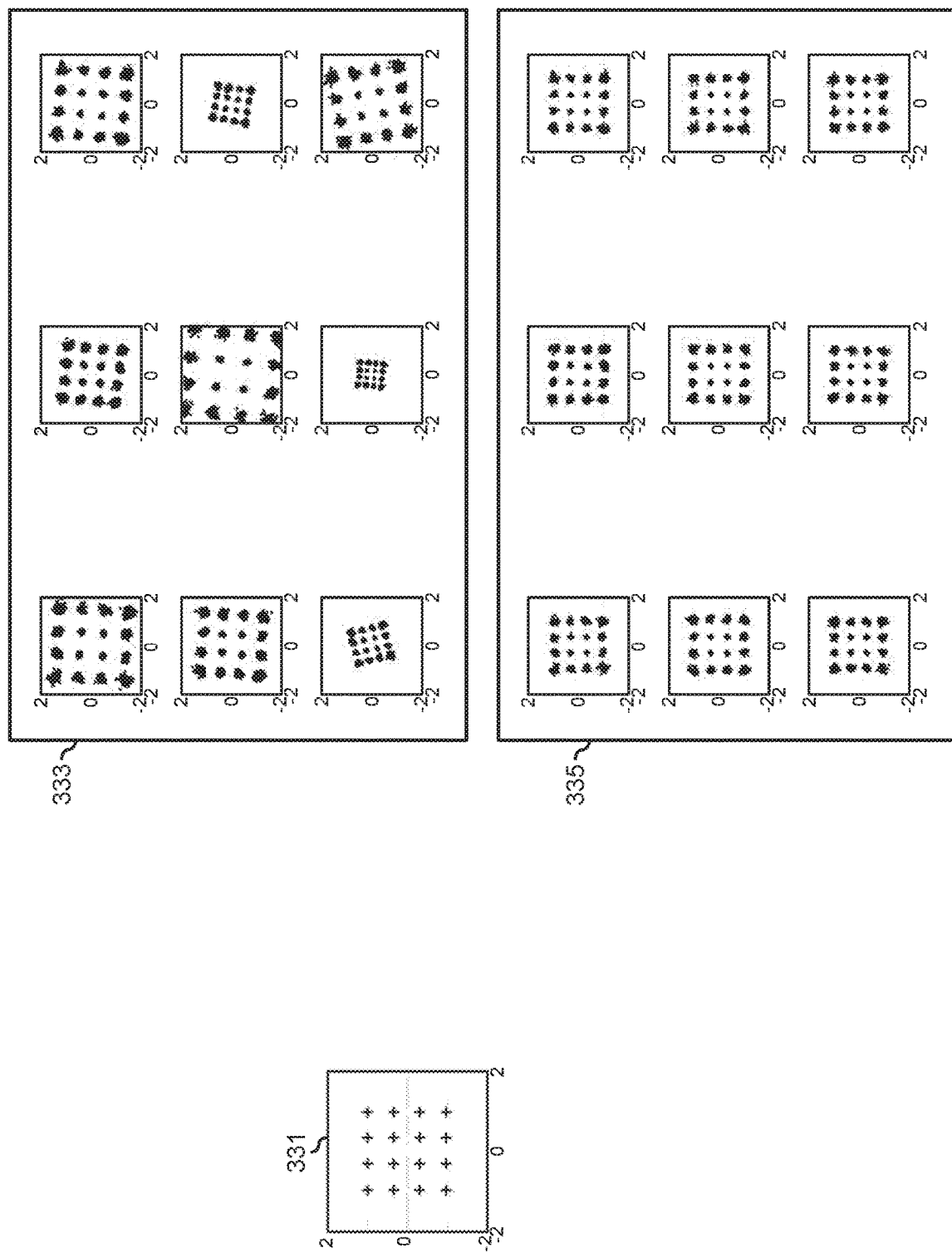
FIG. 3 is a diagram illustrating symbol identification from an alphabet according to an aspect of the present disclosure.

FIG. 3 is a diagram illustrating the resolution of various distortions 333 to symbols in a symbol library 331. As shown, the symbol library 331 may illustrate a finite set of symbols encoded using 16-QAM. While FIG. 3 illustrates 16-QAM, the symbol library 331 may include symbols encoded using other types of modulation. As shown, the various distortions 333 display various distortions caused by the amplifier 115 or other distorting electrical components.

In certain embodiments, the system 100 may identify a pattern in a distortion shown in the various distortions 333 and compare the distorted pattern against the pattern in the symbol library 331. Using the comparison, the system 100 may estimate the distortion of the signal by the amplifier 115 or other electrical components. The system 100 may calculate the distortion of the amplifier 115 without having access to the input of the amplifier 115.

In some embodiments, the system 100 may gather data over a period of time to acquire data over an extended data window. The period of time may be sufficient such that the system 100 may identify symbols within the data. However, extending the period of time may also increase the chance that the distortions of the amplifier 115 may change during the acquisition of data.

As shown in the various distortions 333, the amplifier 115 may linearly deform the polar coordinates of the QAM-16 symbols. For example, the radius $r_o$ for a particular data point at a time t, may be given by the following equation:

$$r_o(t)=r_i(t)(1+\Delta r)(1+r_n(t)),$$

where the $\Delta r$ is a constant deformation of the radius by the amplifier 115 and the $r_n(t)$ is noise. Similarly, the azimuth $\phi_o$ for a particular data point at a time t, may be given by the following equation:

$$\phi_o(t)=\phi_i(t)+\Delta\phi+\phi_n(t),$$

where the $\Delta\phi$ is a constant deformation of the azimuth by the amplifier 115, and the $\phi_n(t)$ is noise. From the various distortions 333, the system 100 may calculate the deformations of the azimuth and the radius by the amplifier 115. The predistorter may be characterized by the two parameters $\Delta r$ and $\Delta\phi$. The system 100 may then apply the inverse of the deformations to the input of the amplifier 115. When the system 100 applies the inverse of the deformation to the input signal, the distorted output signal of the amplifier 115 may be similar to the symbol library 331, as shown in the pre-distorted outputs 335.

The optimal predistorter parameters may be obtained by minimizing the sum J of function values $f$ over a set of N distorted symbols, with the predistortion applied as follows:

$$J = \sum_{i=1}^{N} f(I_i(\Delta r, \Delta\phi), Q_i(\Delta r, \Delta\phi)).$$

Figure 4:
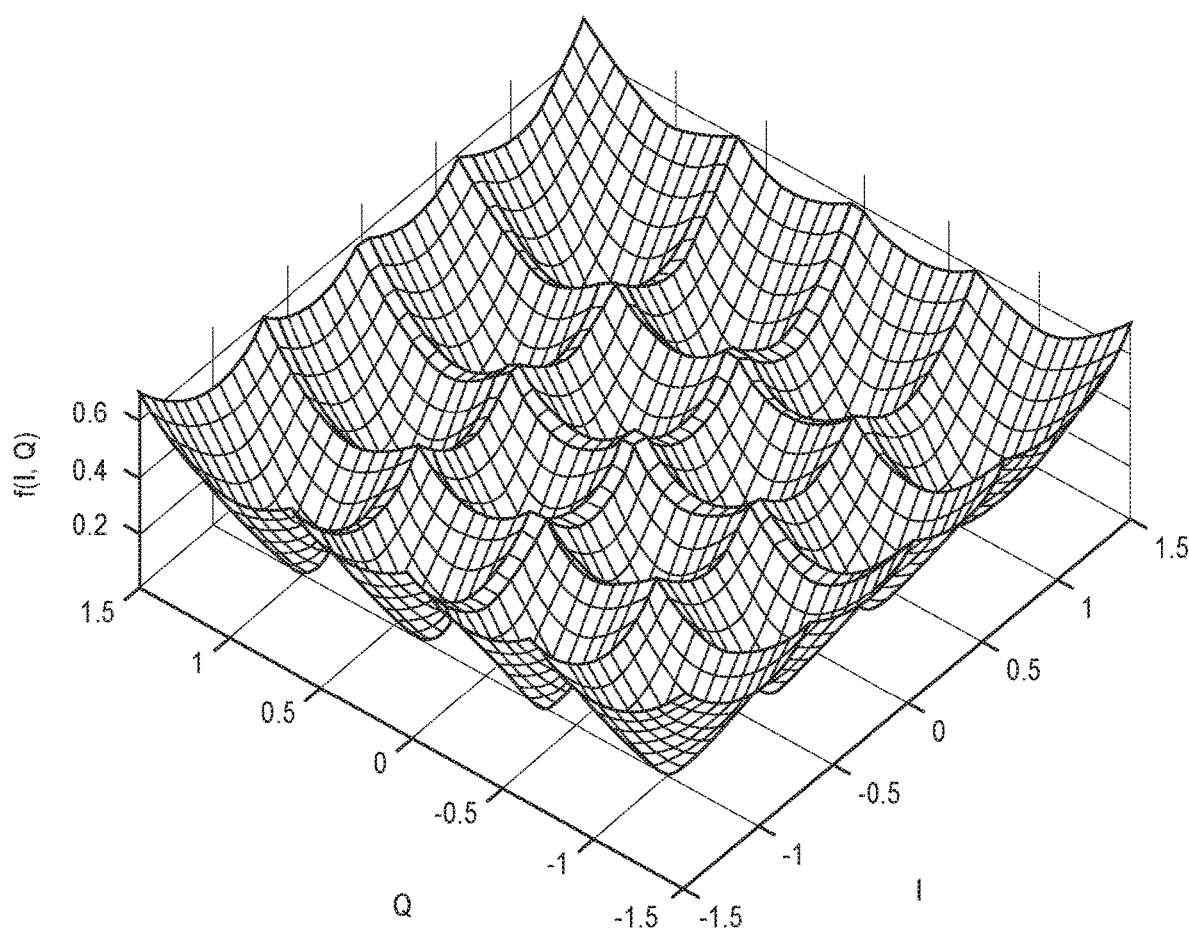
FIG. 4 is a graphical representation of a function which is summed and minimized for improving a predistorter for QAM-16 encoding according to an aspect of the present disclosure.

With the function $f$ defined similarly to the graphed function for improving a predistorter for QAM-16 encoding shown in FIG. 4. The function graphed in FIG. 4 may have 16 local minima that each correspond to specific 16-QAM symbols. The minimized J value corresponds to a situation when all distorted symbols are substantially transformed to any of the alphabet symbols. Ideally, each I and Q distorted value may be transformed to be proximate to any of the finite set of alphabet symbols. The function $f$ value is not sensitive to the permutation of the alphabet symbols. However, the simple transform given by $\Delta r$, $\Delta\phi$ is incapable of symbol permutation and the predistortion may be uniquely determined.

In exemplary embodiments, the system 100 may initially process a training set of data to acquire an initial estimate for the distortion of the amplifier 115. For example, a signal having a large number of random patterns $P_i$ may be fed to the system 100. Each of the random patterns may have a randomly selected $\Delta r$ and $\Delta\phi$, where each of the random patterns has a large number of samples. Additionally, each sample has substantially the same probability of being one of the points in a particular pattern $P_i$. Accordingly, the training set of data S may be defined as:

$$S=\{P_i,\Delta r,\Delta\phi\}$$

The training set of data may be used to train, for example, Gaussian process regression or an artificial neural network model may provide the predistorter parameters $\Delta r$ and $\Delta\phi$ based on the pattern $P_i$ being model input. The training may happen before the trained model is uploaded to the system 100. Accordingly, the training may encompass large sets of data. For example, the set of training data may include tens of thousands of randomly generated patterns.

The system 100 may analyze the real-time data to acquire a current pattern characteristics P. The system 100 may then apply the current pattern characteristics P to a Gaussian process regression model or a neural network model. The model may output the predistorter parameters directly without having to solve the non-convex minimization problem involving the J minimization. The disclosed method may be applied in real-time using a pretrained artificial intelligence model.

In some embodiments, when the system 100 has acquired the model for the deformation of the $\Delta r$ and $\Delta\phi$, the system 100 may calculate a pre-distortion based on the model for the deformation. Using this information, the system 100 may apply the pre-distortion to an input of the amplifier 115. Additionally, after acquiring the model from the training set. The system may use newly acquired data to adjust the applied predistortion.

Additionally, the system 100 may also calculate the $\Delta r$ and $\Delta\phi$ for more general nonlinear deformations. For example, the system 100 may calculate a nonlinear deformation for the radius as:

$$\Delta r(t)=f_1(r_i(t),\phi_i(t)),$$

and the azimuth as:

$$\Delta\phi(t)=f_2(r_i(t),\phi_i(t)).$$

To calculate functions for the nonlinear deformations, the system 100 may use machine learning algorithms as described above. The system 100 may calculate a pre-distortion from the nonlinear deformations, where the system 100 may apply the pre-distortion to an input of the amplifier 115.

Figure 5:
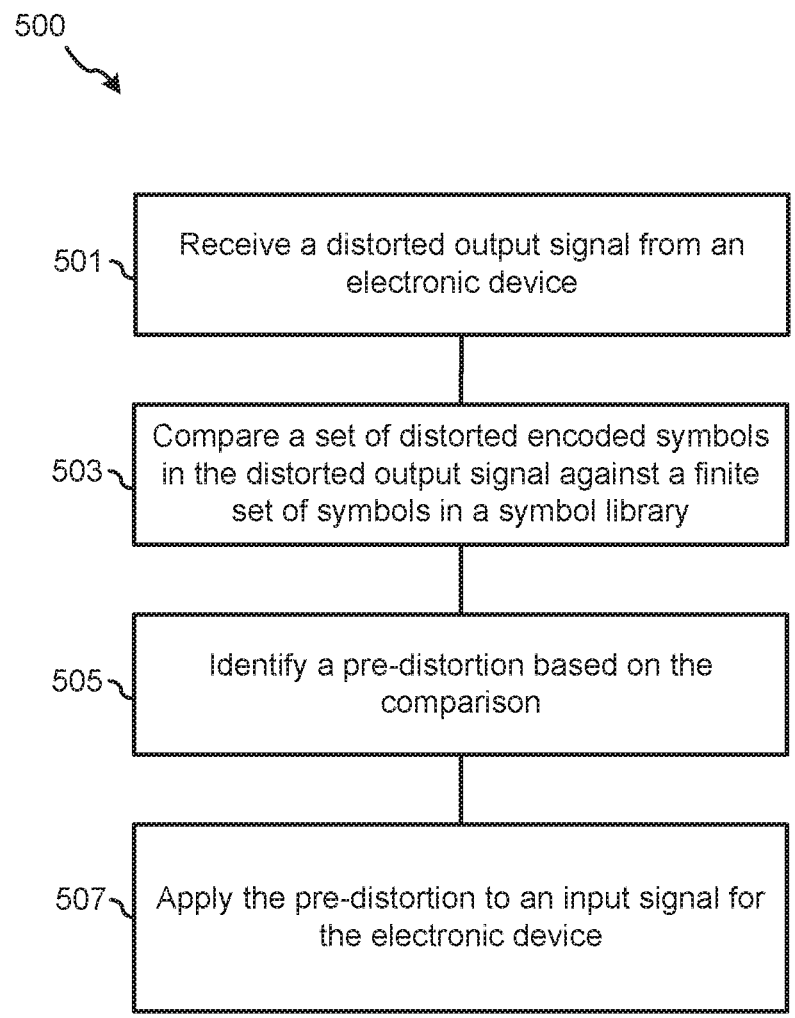
FIG. 5 is a flowchart diagram of a method for providing pre-distortion pattern recognition according to an aspect of the present disclosure.

FIG. 5 is a flowchart diagram of a method 500 for performing pre-distortion pattern recognition. The method 500 proceeds at 501, where a distorted output signal is received from an electronic device. Also, the method 500 proceeds at 503, where a set of distorted encoded symbols in the distorted output signal is compared against a finite set of symbols in a symbol library. Additionally, the method 500 proceeds at 505, where a pre-distortion based on the comparison is identified. Moreover, the method 500 proceeds at 507, where the pre-distortion is applied to an input signal for the electronic device.

Example Embodiments

Example 1 includes a system comprising: an electronic device that provides an output signal, wherein the electronic device applies distortion to the output signal; a pre-distorter that provides an input signal to the electronic device, wherein the pre-distorter applies a pre-distortion to the input signal before the electronic device receives the input signal; and a pre-distorter design block that identifies the distortion from an association between the output signal and a finite set of symbols and updates the pre-distortion based on the association.

Example 2 includes the system of Example 1, wherein the pre-distorter design block identifies the distortion using the output signal without using an undistorted signal.

Example 3 includes the system of any of Examples 1-2, wherein the electronic device is an amplifier.

Example 4 includes the system of any of Examples 1-3, further comprising a down-converter that receives the output signal from the electronic device and down converts the output signal for use by the pre-distorter design block.

Example 5 includes the system of any of Examples 1-4, wherein the finite set of symbols are symbols encoded using quadrature amplitude modulation.

Example 6 includes the system of any of Examples 1-5, wherein the pre-distorter design block identifies deformations of radius and azimuth for symbols encoded in the output signal.

Example 7 includes the system of Example 6, wherein the pre-distorter design block identifies the deformations of the radius and the azimuth based on received training data.

Example 8 includes the system of Example 7, wherein the pre-distortion is calculated by performing machine learning on the received training data.

Example 9 includes the system of any of Examples 6-8, wherein the pre-distorter design block identifies the deformations of the radius and the azimuth as a function of the radius and the azimuth of the symbols encoded in the output signal.

Example 10 includes a method comprising: receiving a distorted output signal from an electronic device, wherein the electronic device receives an input signal; comparing a set of distorted encoded symbols in the distorted output signal against a finite set of symbols in a symbol library; identifying a pre-distortion based on the comparison of the set of the distorted encoded symbols against the finite set of symbols; and applying the pre-distortion to the input signal.

Example 11 includes the method of Example 10, wherein the electronic device is an amplifier.

Example 12 includes the method of any of Examples 10-11, wherein receiving the distorted output signal from the electronic device comprises receiving the distorted output signal over a period of time.

Example 13 includes the method of any of Examples 10-12, further comprising down-converting the distorted output signal from the electronic device before comparing the set of the distorted encoded symbols against the finite set of symbols.

Example 14 includes the method of any of Examples 10-13, wherein the finite set of symbols are symbols encoded using quadrature amplitude modulation.

Example 15 includes the method of any of Examples 10-14, wherein identifying the pre-distortion comprises identifying deformations of radius and azimuth for symbols encoded in the distorted output signal.

Example 16 includes the method of Example 15, wherein identifying the deformations of the radius and the azimuth comprises receiving a training set of data.

Example 17 includes the method of Example 16, wherein the training set of data comprises a random set of patterns having symbols from the finite set of symbols.

Example 18 includes the method of any of Examples 15-17, wherein identifying the deformations of the radius and the azimuth comprises identifying the deformations as a function of the radius and the azimuth of the symbols encoded in the distorted output signal.

Example 19 includes the method of any of Examples 10-18, further comprising updating the pre-distortion as additional symbols are received as encoded in the distorted output signal.

Example 20 includes a system comprising: an amplifier that provides an output signal, wherein the amplifier applies distortion to the output signal; a pre-distorter that provides an input signal to the amplifier, wherein the pre-distorter applies a pre-distortion to the input signal before the amplifier receives the input signal; and a pre-distorter design block that identifies the distortion from an association between the output signal and a finite set of symbols without using an undistorted signal and updates the pre-distortion based on the association.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A system comprising:
an electronic device that provides an output signal, wherein the output signal includes distortion applied to an undistorted signal by the electronic device;
a pre-distorter that provides an input signal to the electronic device, wherein the pre-distorter applies a pre-distortion to the input signal before the electronic device receives the input signal; and
a pre-distorter design block that identifies the distortion from a transform that changes symbols in the output signal to be similar to a finite set of symbols stored in a symbol library and updates the pre-distortion based on the transform.

2. The system of claim 1, wherein the pre-distorter design block identifies the distortion using the output signal without using the undistorted signal.

3. The system of claim 1, wherein the electronic device is an amplifier.

4. The system of claim 1, further comprising a down-converter that receives the output signal from the electronic device and down converts the output signal for use by the pre-distorter design block.

5. The system of claim 1, wherein the finite set of symbols are symbols encoded using quadrature amplitude modulation.

6. The system of claim 1, wherein the pre-distorter design block identifies deformations of radius and azimuth for symbols encoded in the output signal.

7. The system of claim 6, wherein the pre-distorter design block identifies the deformations of the radius and the azimuth based on received training data.

8. The system of claim 7, wherein the pre-distortion is calculated by performing machine learning on the received training data.

9. The system of claim 6, wherein the pre-distorter design block identifies the deformations of the radius and the azimuth as a function of the radius and the azimuth of the symbols encoded in the output signal.

10. A method comprising:
receiving a distorted output signal from an electronic device, wherein the electronic device receives an input signal, wherein the distorted output signal includes distortion applied to the input signal;
comparing a set of distorted encoded symbols in the distorted output signal against a finite set of symbols in a symbol library;
identifying a pre-distortion based on the comparison of the set of the distorted encoded symbols against the finite set of symbols, wherein the pre-distortion comprises a transform that changes symbols in the output signal to be similar to the finite set of symbols; and
applying the pre-distortion to the input signal.

11. The method of claim 10, wherein the electronic device is an amplifier.

12. The method of claim 10, wherein receiving the distorted output signal from the electronic device comprises receiving the distorted output signal over a period of time.

13. The method of claim 10, further comprising down-converting the distorted output signal from the electronic device before comparing the set of the distorted encoded symbols against the finite set of symbols.

14. The method of claim 10, wherein the finite set of symbols are symbols encoded using quadrature amplitude modulation.

15. The method of claim 10, wherein identifying the pre-distortion comprises identifying deformations of radius and azimuth for symbols encoded in the distorted output signal.

16. The method of claim 15, wherein identifying the deformations of the radius and the azimuth comprises receiving a training set of data.

17. The method of claim 16, wherein the training set of data comprises a random set of patterns having symbols from the finite set of symbols.

18. The method of claim 15, wherein identifying the deformations of the radius and the azimuth comprises identifying the deformations as a function of the radius and the azimuth of the symbols encoded in the distorted output signal.

19. The method of claim 10, further comprising updating the pre-distortion as additional symbols are received as encoded in the distorted output signal.

20. A system comprising:
an amplifier that provides an output signal, wherein the output signal includes distortion applied to an undistorted signal by the amplifier;
a pre-distorter that provides an input signal to the amplifier, wherein the pre-distorter applies a pre-distortion to the input signal before the amplifier receives the input signal; and
a pre-distorter design block that identifies the distortion from a transform that changes symbols in the output signal to be similar to a finite set of symbols stored in a symbol library without using the undistorted signal and updates the pre-distortion based on the transform.

* * * * *